US008099696B2

(12) United States Patent
Lehavot et al.

(10) Patent No.: US 8,099,696 B2
(45) Date of Patent: Jan. 17, 2012

(54) METHOD FOR PROVIDING INFORMATION ASSOCIATED WITH AN OVER-CONSTRAINED EVENT IN VERIFICATION OF A CIRCUIT DESIGN

(75) Inventors: Amir Lehavot, San Francisco, CA (US); Vinaya Kumar Singh, Noida (IN); Joezac John Zachariah, Noida (IN); Jose Barandiaran, Austin, TX (US); Axel Siegfried Scherer, Salem, MA (US)

(73) Assignee: Cadence Design Systems, Inc., San Jose, CA (US)

( * ) Notice: Subject to any disclaimer, the term of this patent is extended or adjusted under 35 U.S.C. 154(b) by 244 days.

(21) Appl. No.: 12/263,377

(22) Filed: Oct. 31, 2008

(65) Prior Publication Data
US 2009/0144681 A1    Jun. 4, 2009

Related U.S. Application Data

(62) Division of application No. 11/498,472, filed on Aug. 2, 2006.

(51) Int. Cl.
*G06F 17/50*  (2006.01)
*G06F 9/455*  (2006.01)

(52) U.S. Cl. ...................... 716/106; 716/111
(58) Field of Classification Search .......... 716/2, 5, 716/106, 111
See application file for complete search history.

(56) References Cited

U.S. PATENT DOCUMENTS

| | | | |
|---|---|---|---|
| 6,594,804 B1 | 7/2003 | Hojati | |
| 6,848,088 B1 * | 1/2005 | Levitt et al. | 716/4 |
| 6,959,271 B1 | 10/2005 | Ballam | |
| 7,159,198 B1 | 1/2007 | Ip et al. | |
| 7,412,674 B1 | 8/2008 | Singhal et al. | |
| 7,454,324 B1 * | 11/2008 | Seawright et al. | 703/14 |
| 2004/0230927 A1 | 11/2004 | Chen et al. | |
| 2005/0027542 A1 | 2/2005 | Bordawekar et al. | |
| 2005/0044055 A1 | 2/2005 | Iyer | |
| 2005/0066234 A1 | 3/2005 | Darringer et al. | |
| 2005/0125757 A1 | 6/2005 | Krishnamurthy | |
| 2005/0138585 A1 | 6/2005 | Cerny et al. | |
| 2005/0229044 A1 | 10/2005 | Ball | |
| 2005/0278576 A1 | 12/2005 | Hekmatpour | |
| 2006/0010428 A1 | 1/2006 | Rushby et al. | |
| 2006/0085774 A1 | 4/2006 | Moorby | |
| 2006/0150163 A1 | 7/2006 | Chandane | |
| 2006/0206840 A1 | 9/2006 | Iwamura | |
| 2006/0271890 A1 | 11/2006 | Hekmatpour et al. | |
| 2007/0005533 A1 | 1/2007 | Iyer et al. | |

(Continued)

OTHER PUBLICATIONS

Habibi, et al., "Towards an Efficient Assertion Based Verification of SystemC Designs", IEEE 2004, pp. 19-22.

*Primary Examiner* — Suresh Memula
(74) *Attorney, Agent, or Firm* — Sawyer Law Group, P.C.

(57) ABSTRACT

An automated debugging method and system for over-constrained circuit verification environment are described. Useful information related to circuit evaluation and/or over-constrained event is collected and provided. The information may include: clock cycles at which an over-constrained event occurs; identification of a minimum subset of constraints that will cause an over-constrained event to occur; signal ports having an associated signal that can not switch between different signal states; whether a triggering signal event has occurred during the evaluation; indicating whether constraints in the evaluation are realizable, etc. Novel approaches for detecting and obtaining the useful information also are described.

9 Claims, 6 Drawing Sheets

U.S. PATENT DOCUMENTS

| | | |
|---|---|---|
| 2007/0074141 A1 | 3/2007 | Takei |
| 2007/0074152 A1* | 3/2007 | Roe .............................. 717/104 |
| 2007/0101216 A1 | 5/2007 | Abramovici |
| 2007/0226663 A1 | 9/2007 | Bormann et al. |
| 2008/0066032 A1* | 3/2008 | Levitt et al. ....................... 716/5 |
| 2008/0104556 A1 | 5/2008 | Yamada |

* cited by examiner

METHOD FOR PROVIDING INFORMATION ASSOCIATED WITH AN OVER-CONSTRAINED EVENT IN VERIFICATION OF A CIRCUIT DESIGN

RELATED APPLICATION

This application is a divisional of U.S. patent application Ser. No. 11/498,472, filed Aug. 2, 2006, entitled "AUTOMATED DEBUGGING METHOD AND SYSTEM FOR OVER-CONSTRAINED CIRCUIT VERIFICATION ENVIRONMENT", the contents of which are incorporated herewith by reference in its entirety.

FIELD OF THE DISCLOSURE

This application relates generally to the functional verification of electronic designs, and more specifically, to debugging method and system for isolating causes of an over-constrained circuit verification environment.

BACKGROUND OF THE INVENTION

Assertion languages, which are widely used in the electronic chip design industry in designing circuits, allow circuit designers to describe acts of a circuit and embed information into their designs to facilitate verification using computer models. Assertions are built up using Boolean expressions, or conditions, which are evaluated at certain times during the execution of the design. For example, the assertion "always C", where C is a condition, says that C must be true in each clock cycle. More complex, multi-cycle behavior can be expressed with sequences, which consist of a list of conditions that may or must be true in successive cycles, such as c1, c2, c3, . . . , cn, where c1 through cn are conditions that may or must be true in cycles 1 through n.

A procedure, called formal analysis, is used by the circuit design industry in verifying assertions based on a set of constraints or verification requirements. Assertions that are being verified need to satisfy the constraints. A formal analysis tool tries to disprove assertions by analyzing the circuit design and the constraints. If the formal analysis tool cannot disprove an assertion by finding a failure under the constraints, then the tool reports a passing result, which means that no failures were found in this design using the constraint set.

The selection and use of constraints in formal analysis directly affect the scope of design verifications. In certain extreme cases, logically flawed constraints or overly strict constraints allow only a small portion, or even nothing, in a circuit design to be explored. This type of constraints or verification requirements is "over-constrained," which is usually caused by errors in the constraints specification. Over-constrained verification requirements lead to unexpected results. The formal analysis tool cannot satisfy conflicting constraints. Tools can report assertion failures only if those failures satisfy the constraints. In the absence of failures, tools report a passing result.

For instance, the following PSL (Property Specification Language) constraints illustrate an example of over-constrained verification requirements:
Constraint A (signal a should always be high (1/true) for all times):
assume_always_a: assume always (a)
Constraint B: (Assume that signal a should never be high for all times):
assume_never_a: assume never (a)

The first constraint states that "a" should always be high, and the second constraint says "a" should never be high. If both constraints are used in a formal analysis where signal "a" is referenced in the fan-in cone of an assertion, an over-constrained situation occurs. It is not possible to satisfy both constraints at the same time, as they basically express the exact opposite behavior. In this case, the over-constrained situation is a result of conflicting statements related to a common signal a, and does not include any logic of the design.

In the following example, two PSL constraints and a Verilog assignment to a wire b, shows another type of over-constrained situation:
b takes the inverted value of a. In other words b is not a.
assign b=! a;
Assume that signal a should always be high (1/true) for all times.
assume_always a: assume always (a);
Assume that signal b should always be high (1/true) for all times.
assume_never_a: assume always (b);
In this case, the conflict is caused by a combination of the constraints and the logic of the design (assignment to b).

For illustration purpose, the above examples use very simple scenarios to explain the mechanism of over-constrained situations. In real world, however, circuit designs involve many complex constraints and driving logic. Detection of and debugging over-constrained situations become a very hard task.

Therefore, there is a need for an effective and automatic approach for detecting and debugging over-constrained situations. It is still desired to obtain more useful information related to the occurrence of over-constrained events, to assist debugging.

SUMMARY OF THE DISCLOSURE

This disclosure describes various embodiments for detecting and debugging an over-constrained situation during verification of circuit designs.

An embodiment of this disclosure provides a method for isolating a cause of an over-constrained situation occurring during verification of a circuit design. The method accesses information related to the circuit design and accessing constraints, and detects an existence of an over-constrained event in verifying the circuit design relative to the constraints. A process is performed to determine whether the constraints are realizable. If the constraints are realizable, a minimum subset of the constraints that permits an over-constrained event associated with the verification of the circuit design continue to occur is identified, and information related to the minimum subset of the constraints is provided. A cover check may be used to detect the existence of an over-constrained event associated with the verification of the circuit design. Information related to the cover check, the minimum subset of the constraints and their design fan-in may be provided. In one embodiment, if it is determined that the constraints are not being realizable, a result indicating conflicting constraints is reported.

In one embodiment, the minimum subset of the constraints does not contain any subset of constraints that will render an over-constrained event to occur. In another aspect, a unique process is performed to identify a minimum subset of the constraints. The process includes (a) dividing the constraints into multiple groups of constraints; (b) determining whether one of the multiple groups of constraints will trigger an over-constrained event; (c) when one of the multiple groups of constraints triggers an over-constrained event, dividing the group of constraints triggering an over-constraint event into further multiple groups; (d) determining whether any of the further multiple groups of constraints will trigger an over-constrained event; and (e) repeating the dividing and determining until no more groups cause an over-constrained event.

In another embodiment, a minimum subset of the constraints is identified by: (a) selecting a constraint from the constraints; (b) determining whether the constraints excluding the selected constraint will trigger an over-constrained event; (c) when the constraints excluding the selected constraint will trigger an over-constrained event, setting the constraints excluding the selected constraint to be the minimum subset of the constraints; (d) selecting another constraint from the constraints excluding the selected constraint; and (e) repeating elements (b) through (d) until no more triggers of an over-constrained event occurs.

Another embodiment of this disclosure provides a method for isolating a cause of an over-constrained situation occurring during verification of a circuit design. Information related to the circuit design and constraints is accessed. The constraints include a fairness constraint. The fairness constraint is converted into an assertion. The converted assertion is verified based on the constraints excluding the fairness constraint. A determination of an existence of an over-constrained event according to a result of the verifying occurs. If an over-constrained event associated with the converted assertion exists, a minimum subset of the constraints excluding the fairness constraint, that permits an over-constrained event associated with the converted assertion continue to occur is identified, and information related to the identified minimum subset is provided. In one aspect, the information related to the minimum subset includes design fan-in. In another aspect, if an over-constrained event associated with the converted assertion does not occur, then a determination of whether an over-constrained event associated with the circuit design and the constraints exists, and whether the constraints are realizable. If the constraints are realizable, a minimum subset of the constraints that permits an over-constrained event associated with the verification of the circuit design continue to occur is identified, and information related to the minimum subset of the constraints is provided. In another aspect, if the constraints are not realizable, a result is produced to indicate conflicting constraints.

This disclosure describes a method for checking a status of a signal port of a circuit design. In performing the method, information related to the circuit design is accessed. A determination of whether a signal associated with the signal port can change from a first state to a second state occurs, such as between logic '0' and logic '1.' An output indicating a result of the determining is then generated. In one embodiment, if the signal cannot change from the first state to the second state, an output is generated provide information of the signal port.

In still another embodiment of this disclosure, a method is proposed for obtaining information associated with verification of a circuit design. The method accesses information related to the circuit design and constraints, determines an occurrence of an over-constrained event in verifying the circuit design relative to the constraints, and provides clock cycle information associated with the occurrence of the over-constrained event. In one aspect, the occurrence of an over-constrained event is determined by accessing information related to pre-specified clock cycles, and determining whether an over-constrained event occurs at each of the pre-specified clock cycles. The clock cycle information may include information related to the pre-specified clock cycles and whether an over-constrained event occurs at each of the pre-specified clock cycles. The pre-specified clock cycles may not be continuous. In another aspect of the embodiment, the pre-specified clock cycles include a first clock cycle and a second clock cycle. If an over-constrained event does not occur at the first clock cycle, and an over-constrained event occurs at the second clock cycle, then a determination is made as to whether an over-constrained event occurs at a clock cycle between the first clock cycle and the second clock cycle.

The method accesses information related to constraints and assertion information related to the circuit design. The assertion information specifies a condition associated with the signal event. Derivative assertion information corresponding to the assertion information is then generated by removing the condition from the assertion information. Another embodiment of this disclosure provides a method for obtaining information associated with verification of a circuit design, by generating derivative assertions based on the circuit design, for verification. The method accesses information related to constraints and assertion information related to the circuit design. The assertion information specifies a condition associated with the signal event. Derivative assertion information corresponding to the assertion information is then generated by removing the condition from the assertion information. Verification is performed to verify the derivative assertion information by applying the constraints, and a result of the verifying is generated. If the verification of the derivative description information fails, the method provides information associated with the assertion information corresponding to the failed derivative assertion information. In one example, the provided information may indicate that the assertion information passes verification due to an over-constrained situation. Similar concepts are applicable to constraints. For instance, one of the constraints may specify a condition associated with a signal event. A derivative assertion corresponding to the at least one of the constraints is generated by removing the condition from the at least one of the constraints. Verification of the derivative assertion is performed by applying the constraints, and a result of the verifying is generated.

A further embodiment of this disclosure provides a method for providing information associated with verification of a circuit design, indicating whether a triggering or enabling signal event has occurred during the verification. A statement related to the circuit design includes a first signal event triggering a check of a second signal event. Information related to constraints is accessed. Verification of the circuit design is performed by applying the constraints. A result is provided indicating whether the first signal event occurs during the verification.

The embodiments and methods in this disclosure may be implemented on a machine-readable medium bearing instructions which, upon execution by a data processing system, causing the data processing system to perform the methods as described this disclosure.

BRIEF DESCRIPTION OF THE DRAWINGS

The present disclosure is illustrated by way of example, and not by way of limitation, in the figures of the accompanying drawings and in which like reference numerals refer to similar elements and in which.

DETAILED DESCRIPTION OF THE DISCLOSURE

In the following description, for the purposes of explanation, numerous specific details are set forth in order to provide a thorough understanding of the present disclosure. It will be apparent, however, to one skilled in the art that the present disclosure may be practiced without these specific details. In other instances, well-known structures and devices are shown in block diagram form in order to avoid unnecessarily obscuring the present disclosure.

Figure 1:
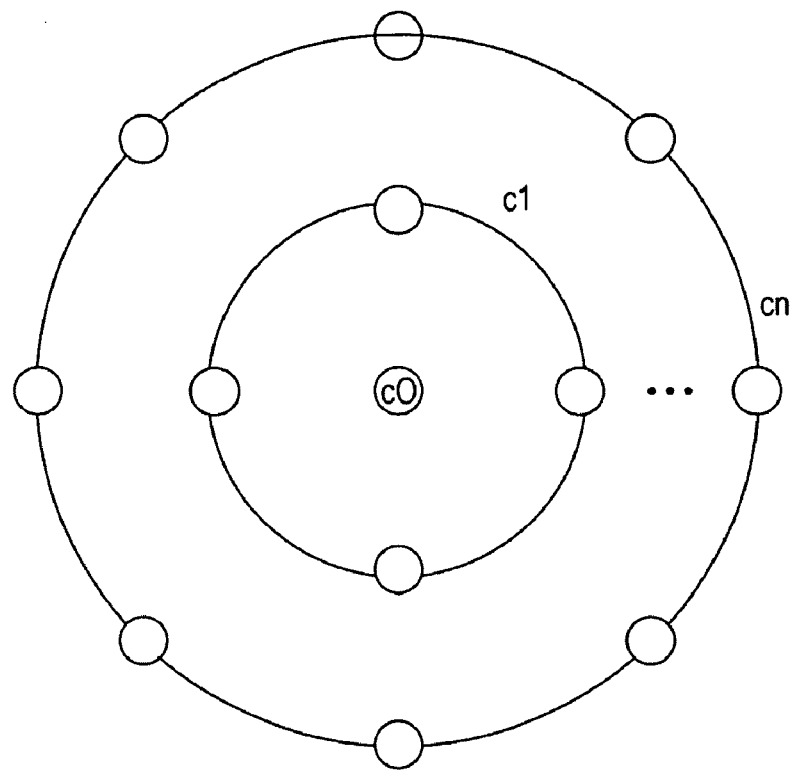
FIG. 1 shows the next state function computations from initial state for both design and constraints.
Figure 1:
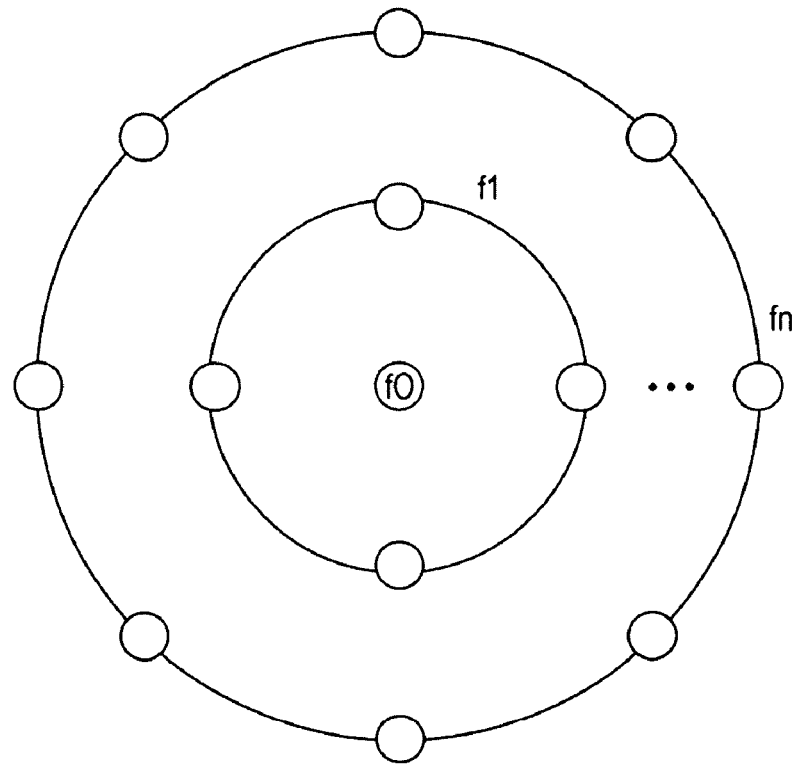

During verification of a circuit design, an over-constrained situation occurs either because constraints are not realizable, or due to the design being in conflict with the constraints (i.e. truncated execution paths). FIG. 1 shows functional traces of a circuit design and constraints. Design set F={f0,f1, . . . , fn, . . . } is the functional trace of the design, where f0 is the design function at an initial state, f1 is the design function at the first step, and so on; and constraint set C={c0,c1, . . . , cn . . . } is the functional trace of the constraints, where c0 is constraint's function at an initial state and c1 is constraint's function at the first step, and so on. These functions are computed using next state function, starting from an initial state. FIG. 1 shows the next state function computations from initial state for both design and constraints.

According to a first embodiment of this disclosure, an automated method, executed by computers, is provided for detecting and debugging over-constrained situations occurred during evaluation of circuit designs. Properties of a circuit design can be classified as "safety" or "liveness." A safety property describes behavior with respect to a single or multiple cycles, bounded in time. In other words, a safety property typically expresses that "something bad will not happen."

On the other hand, a liveness property describes a circuit behavior that is not bounded in time. The liveness property is also called an eventuality. In other words, a liveness property expresses that "something good will eventually happen"—therefore expressing that the device is live.

For weak safety properties, an over-constrained situation occurs, if:
condition A: an element in constraint set C is false; or
condition B: an element of constraint set C in conjunction with a corresponding element of assertion set F is false at some steps.

If condition A is true, then the constraints in constraint set C are said to be not realizable (the constraints are conflicting). This means that there cannot be a valid design under these constraints with an infinite execution path. On the other hand, if condition B is true, then constraints and circuit design are said to be in conflict at some step(s) or clock cycle(s). In other words, the constraints conflict with the circuit design. This results into truncated execution paths in the design under constraints (execution paths are truncated at some steps where design and constraints are in conflict).

According to an embodiment of this disclosure, an automated method is provided to isolate a cause of an over-constrained situation occurring during verification of a circuit design having weak safety properties. A systematic search is performed to identify a minimum set of constraints, whose presence causes an over-constrained situation to occur during a circuit design verification process (detailed process for identifying a minimum subset of constraints will be described shortly). In other words, a minimum constraint set is a subset of the constraints where no more constraint can be further removed from the subset without causing the over-constrained situation to disappear. If an over-constrained situation is caused by condition A, then the minimum set of constraints is reported. On the other hand, if it is determined that an over-constrained situation is caused by condition B, then the minimum set of constraints with its associated design fan-in is reported.

An exemplary method detects an existence of an over-constrained event in verifying the circuit design relative to given constraints, and determines whether the constraints are realizable. For instance, the occurrence of an over-constrained event can be determined by selecting a cover check in the formal analysis process and performing vacuity checks. Known techniques for vacuity checks include Formal Check by Cadence Design Systems, Inc. or BlackTie by Verplex (now Cadence). The cover check is selected based on the constraints and assertions to be tested, to ensure the detection of an over-constrained event, if one exists. Responsive to the constraints being realizable, a procedure is performed to identify a minimum subset of the constraints that permits an over-constrained event associated with the verification of the circuit design to continue to occur (detailed process for identifying a minimum subset of constraints permitting an over-constrained event to occur will be described shortly). After the minimum subset of the constraints is identified, information related to the minimum subset and/or the cover check and their design fan-in is provided. The information will help circuit designers to identify the cause of the over-restrained situation.

The following examples illustrate the operation of the exemplary automated method.

EXAMPLE 1

```
module top(req, clk, ack);
input req, clk;
output ack;
/* assume that there is a never a situation where signal req (request)
is high and signal ack (acknowledge) is low, followed by any number of
signals ack being low, followed by an occurrence of signal req being
high and ack being low.
In other words, there is never a situation where req is high two times
(either in a row or non-consecutive) without ack being high in between.
*/
//psl C1: assume never {req &!ack; !ack[*]; req&!ack} @(posedge clk);
/* assume that if a signal req is high then req has to be high again
between 2 and 6 cycles later */
//psl C2: assume always ({req} |=> {[*1:5];req}) @(posedge clk);
/* check that if a signal ack is high then req has to be high again
between 2 and 6 cycles later.*/
//psl A1: assert always ({req} |=> {[*1:5];ack}) @(posedge clk);
/* check if it is possible to find a case where signal req is high
followed by ack being high any time later.*/
//psl Cov1: cover {req;[*];ack} @(posedge clk);
/* signal ack is tied to low (0) */
assign ack=1'b0;
endmodule
```

Thus, the two constraints in example 1 are:
C1: assume never {req &!ack; !ack[*]; req&!ack} @(posedge clk);
No consecutive request without an acknowledgement.

C2: assume always ({req} |=>{[*1:5];req}) @(posedge clk);

After a request, the next request is issued within 2 to 6 cycles.

In the design, 'ack' is tied to '0.' This means that C1 and C2 can not be met on any infinite path, in which a 'req' is issued. Constraint C2 would require a fresh request to be issued. However, if the design satisfies constraint C2, it will always fail constraint C1 because 'ack' is tied to constant '0' and there cannot be an acknowledgement between two requests, as required under constraint C1. The executions paths with 'req' going high will be truncated.

If a formal analysis is performed on the design using constraints as discussed above, assertion A1 will pass (with trigger pass) and the cover check "Cov1" fails. This is because of truncated paths (condition "B"). The occurrence of truncated paths is detected by "Cov1" cover check (or by an automated property "finish" check).

In Example 1, even if constraint C1 or C2 is removed, the cover check "Cov1" still fails. Accordingly, none of the constraints C1 and C2 is required for "Cov1" to fail. The formal analysis fails because ack it tied to 0. Accordingly, the over-constrained situation occurs due to a design bug or cover check "Cov1" bug, because none of the constraints triggers the failure in the formal analysis. According to one embodiment, the automated method reports detailed information of the cover check "Cov1" with its design fan-in, Example 2, listed below, is a modification of Example 1.

```
module top(req, clk, ack);
input req, clk;
output ack;
//psl C1: assume never {req &!ack; !ack[*]; req&!ack} @(posedge clk);
//psl C2: assume always ({req}|=>{[*1:5];req}) @(posedge clk);
//psl A1: assert always ({req}|=>{[*1:5];ack}) @(posedge clk);
//psl Cov1: cover {req;[*];ack} @(posedge clk);
reg state;
reg ack;
    always @(posedge clk)
    begin
        if(req && state==1'b0)
        begin
            state<=1'b1;
            ack<=1'b0;
        end
        else
        begin
            if(req)
            begin
                state <=1'b0;
                ack<=1'b1;
            end
        end
    end
endmodule
```

In Example 2, cover check "Cov1" fails and assertion "A" passes. However, if constraint C1 is removed, cover check "Cov1" will pass. In this case, a minimum constraint set is "C1." The automated method provides information related to at least one of cover check "Cov1", constraint "C1" and their respective design fan-in are reported.

Figure 2:
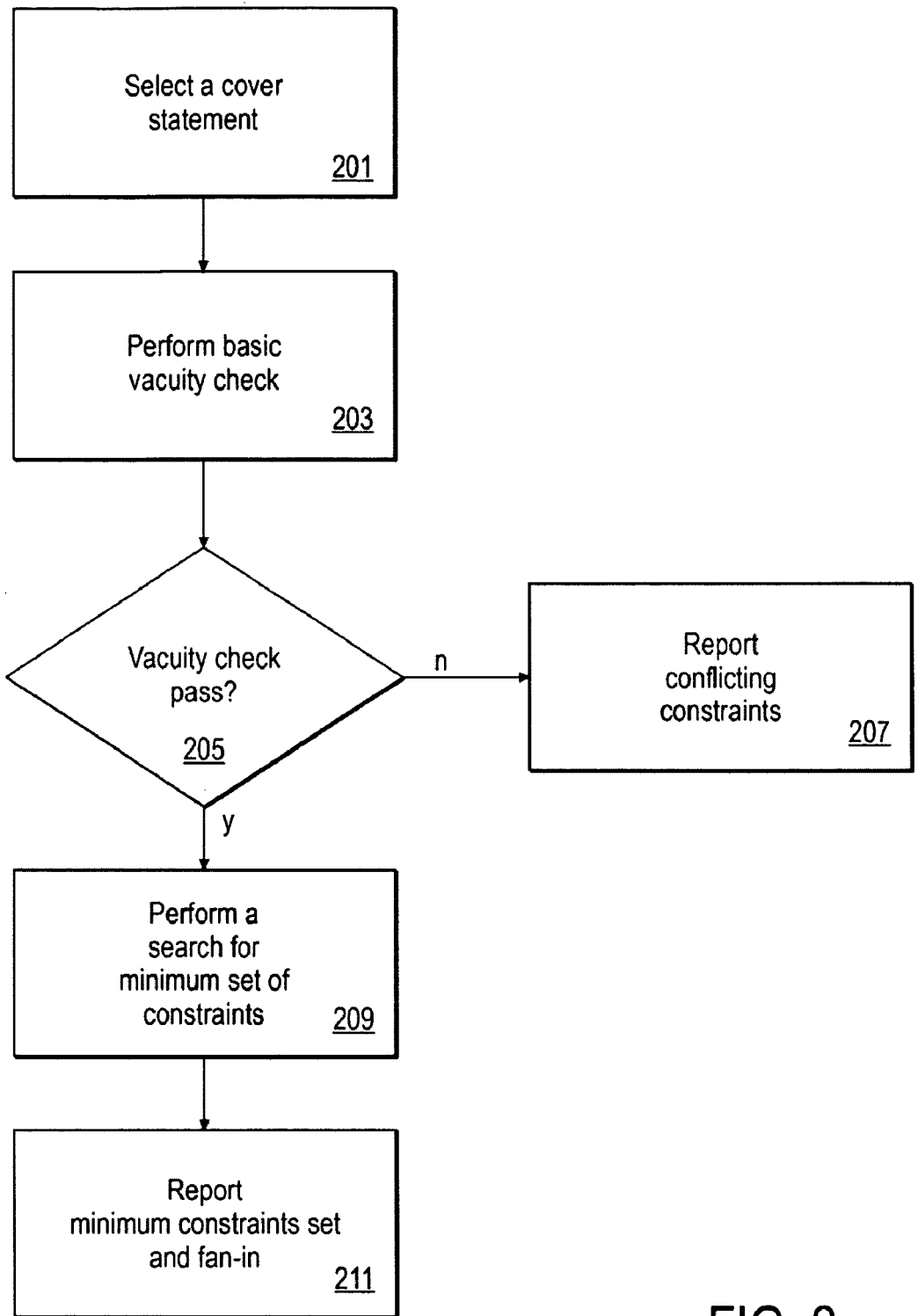
FIG. 2 is a flow chart illustrating an exemplary automated method for providing information related to an over-constrained event.

FIG. 2 is a flow chart illustrating an exemplary automated method for providing information related to an over-constrained event. In Block 201, a cover check is selected to detect the existence of an over-constraining event. By the definition of over constraining, the cover check shall fail. In Block 203, a vacuity check is performed to determine if the constraints are realizable. In other words, the block determines whether the constraints are in conflict even without the design under evaluation. In Block 205, if it is determined that the constraints are not realizable, Block 207 is performed reporting conflicting constraints. If the vacuity check is passed, Blocks/acts 209 and 211 are performed to identify and report a minimum set of constraints that causes the cover check to fail. In other words, a minimum constraint set is a subset of the constraints where no more constraint can be further removed without letting the cover check to pass. All the fairness constraints will automatically be removed during Block 209.

Another embodiment of this disclosure provides an automated method for isolating a cause of an over-constrained situation occurring during verification of a circuit design having strong liveness properties. For strong liveness properties, an over-constrained situation is defined as:

Condition A: an element of constraint set C is false. (i.e., constraints are not realizable);

Condition B: an element of constraint set C in conjunction with corresponding element of assertion set F is false at some steps (i.e., truncated executions paths); or Condition C: All paths are unfair (i.e., a fairness constraint on inputs fails).

For strong liveness properties, the operations of Condition A and Condition B are similar to those discussed earlier relative to Example 1 and Example 2. The operation of Condition C under strong liveness properties is now discussed using the following Example 3.

EXAMPLE 3

```
module top(req, clk, ack);
input req, clk;
output ack;
//psl C1: assume never {req &!ack; !ack[*]; req&!ack} @(posedge clk);
//psl C2: assume always (eventually! {req}) @(posedge clk);
//psl A1: assert always ({req}|=>{[*1:5];ack}) @(posedge clk);
//psl Cov1: cover {req;[*];ack} @(posedge clk);
reg state;
reg ack;
    always @(posedge clk)
    begin
        if(req && state==1'b0)
        begin
            state<=1'b1;
            ack<=1'b0;
        end
        else
        begin
            if(req)
            begin
                state <=1'b0;
                ack<=1'b1;
            end
        end
    end
endmodule
```

In Example 3, constraint C2 is a fairness constraint. Request 'req' is required to happen infinitely often. However, constraint C1 places a requirement that 'ack' can not remain '0' between two consecutive 'req.' The design logic further puts additional constraints on the behavior of 'req' and 'ack.' If we convert 'C2' into an assertion then it fails. This means that input 'req' is unfairly constrained.

An embodiment of this disclosure provides an automated method for providing information related to an over-constrained situation occurring during verification of a circuit design having strong liveness properties. Information related to the circuit design and constraints is accessed. The constraints include a fairness constraint. The fairness constraint in then converted into an assertion. Verifications are performed on the converted assertion based on the constraints excluding the fairness constraint. Responsive to the occurrence of an over-constrained event associated with the converted assertion, a minimum subset of the constraints excluding the fairness constraint is identified. The minimum subset permits an over-constrained event associated with the converted assertion continue to occur. Information related to the minimum subset is reported. In one embodiment, the reported information includes fan-in information of the fairness constraint when used as an assertion. According another embodiment, responsive to a non-existence of an over-constrained event associated with the converted assertion, an existence of an over-constrained event associated with the circuit design and the constraints is determined. It is further determined whether the constraints are realizable. Responsive to the constraints being realizable, a minimum subset of the constraints that permits an over-constrained event associated with the verification of the circuit design continues to occur is determined, and information related to the minimum subset of the constraints is provided. In still another embodiment, if the constraints are not realizable, a result indicating the existence of conflicting constraints is reported.

Figure 3:
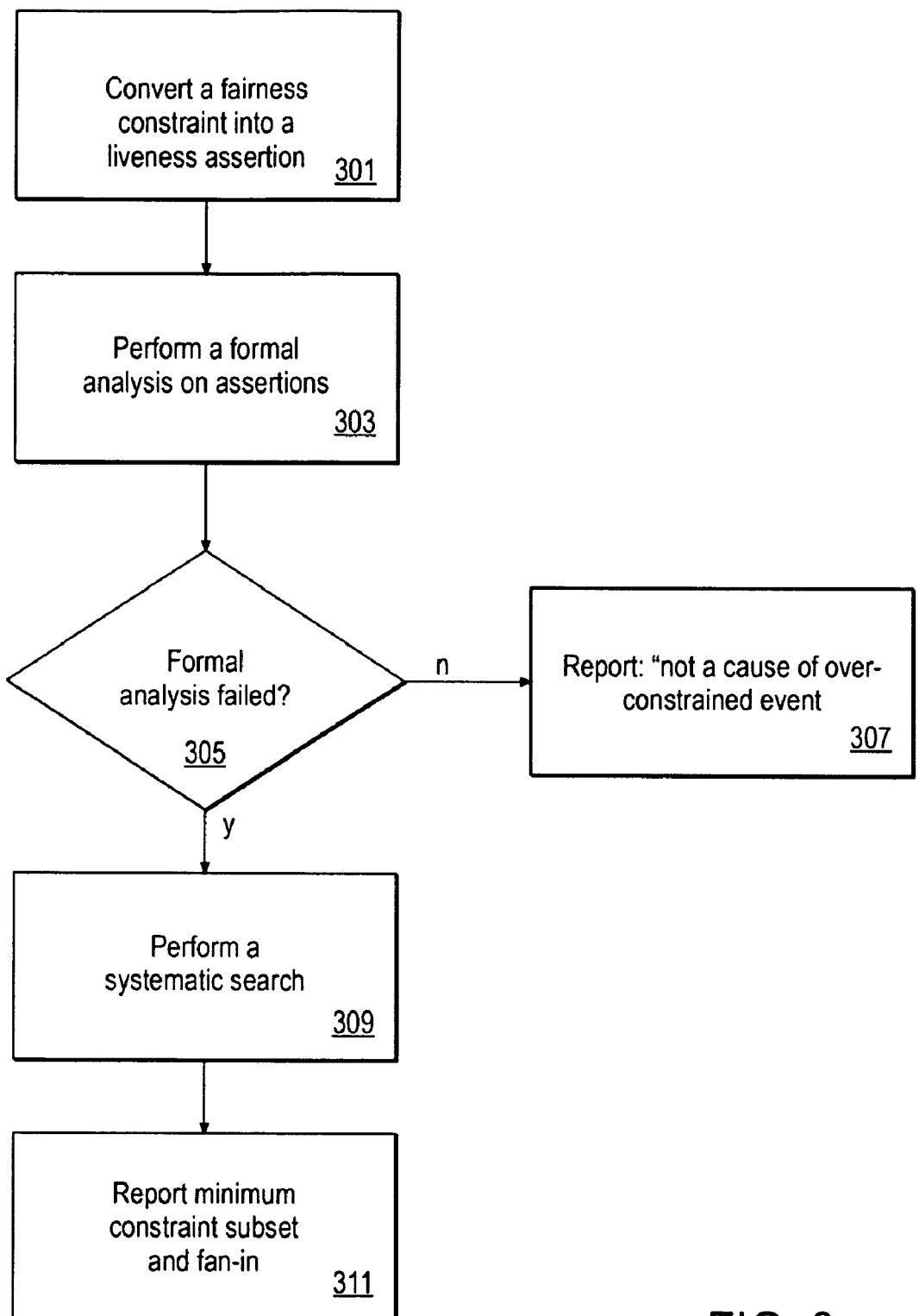
FIG. 3 is a flow chart showing for checking for over-constraining for fairness constraints.

FIG. 3 is a flow chart for checking fairness constraints (condition C). In Block 301, a fairness constraint is converted to an assertion. In Block 303, formal analysis is performed on the converted assertion. In Block 305, if the assertion fails the formal analysis, it is determined that an over-constrained event occurs. A systematic search is performed to find a minimum set of constraints when that assertion still fails (Block 309) and information related to the minimum set of constraints is reported (Block 311). The reported information includes details of the minimum set of constraints and optionally their fan-in. On the other hand, if the assertion passes the formal analysis in Block 305, a report indicating that the fairness constraint is not a cause of the over-constrained event is generated (Block 307). If desired, acts for checking the status of conditions "A" and "B" are further performed using the process described earlier relative to Examples 1 and 2. Repeated descriptions related to the process are omitted to avoid redundancy.

Identification of Minimum Set of Constraints

As discussed earlier, an exemplary method of this disclosure performs a unique procedure to identify, among a given set of constraints, a minimum set of constraints that will cause an over-constrained event continue to occur. In other words, no constraint can be further removed from the minimum set of constraints to maintain the over-constrained situation.

For instance, let constraints ASSUME={C1,C2, ... Cn} be a set of constraints of an over-constrained design D with respect to a cover check COV. This means formal analysis of COV on design D fails under constraints ASSUME. A unique procedure is used to find a subset of ASSUME, say ASSUME', such that cover check COV fails on design D under constraints ASSUME', and no proper subset of ASSUME' exists such that cover check COV still fails on design D under the further constraint subset.

Figure 4A:
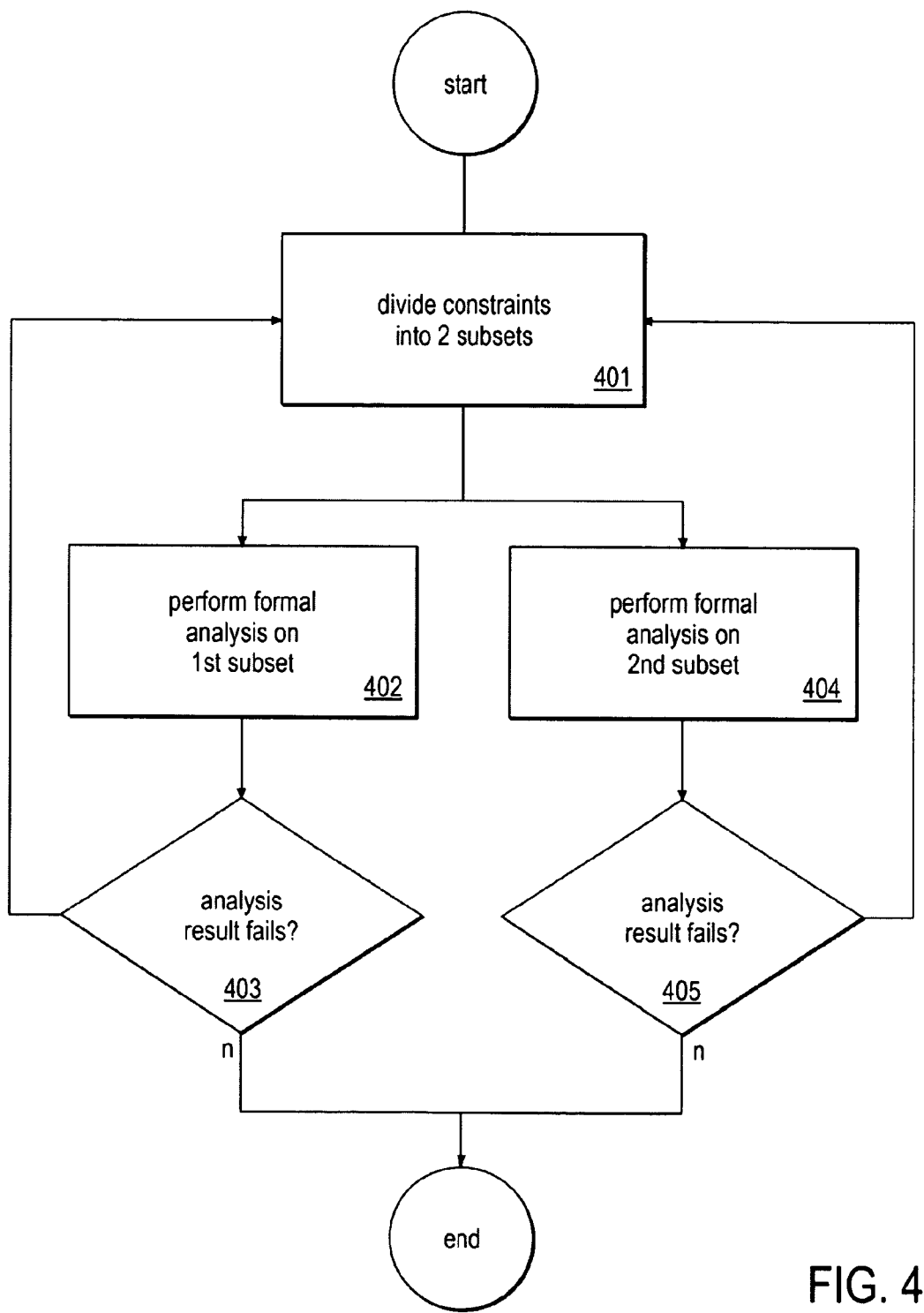
FIG. 4A shows a flow chart of an exemplary process for identifying, among a given set of constraints, a minimum subset of constraints that will maintain an over-constrained event.

FIG. 4A shows a flow chart of an exemplary process for identifying, among a given set of constraints, a minimum subset of constraints that will maintain an over-constrained event. In Block 401, a constraint set ASSUME is divided into to constraint subsets, ASSUME1 and ASSUME2. The two subsets may be two equal halves. If ASSUME is null set then return ASSUME. In Blocks 402 and 403, a formal analysis is performed to determine whether cover check COV fails under ASSUME1 on design D. If the determination result is affirmative, then ASSUME is set to be equal to ASSUME1 (Block 403) and the process repeats Block 401. Similar blocks are performed on constraint subset ASSUME 2 to determine if cover check COV fails under ASSUME2 on design D. If yes, then ASSUME=ASSUME2, and Block 401 is repeated (Blocks/acts 404 and 405).

Figure 4B:
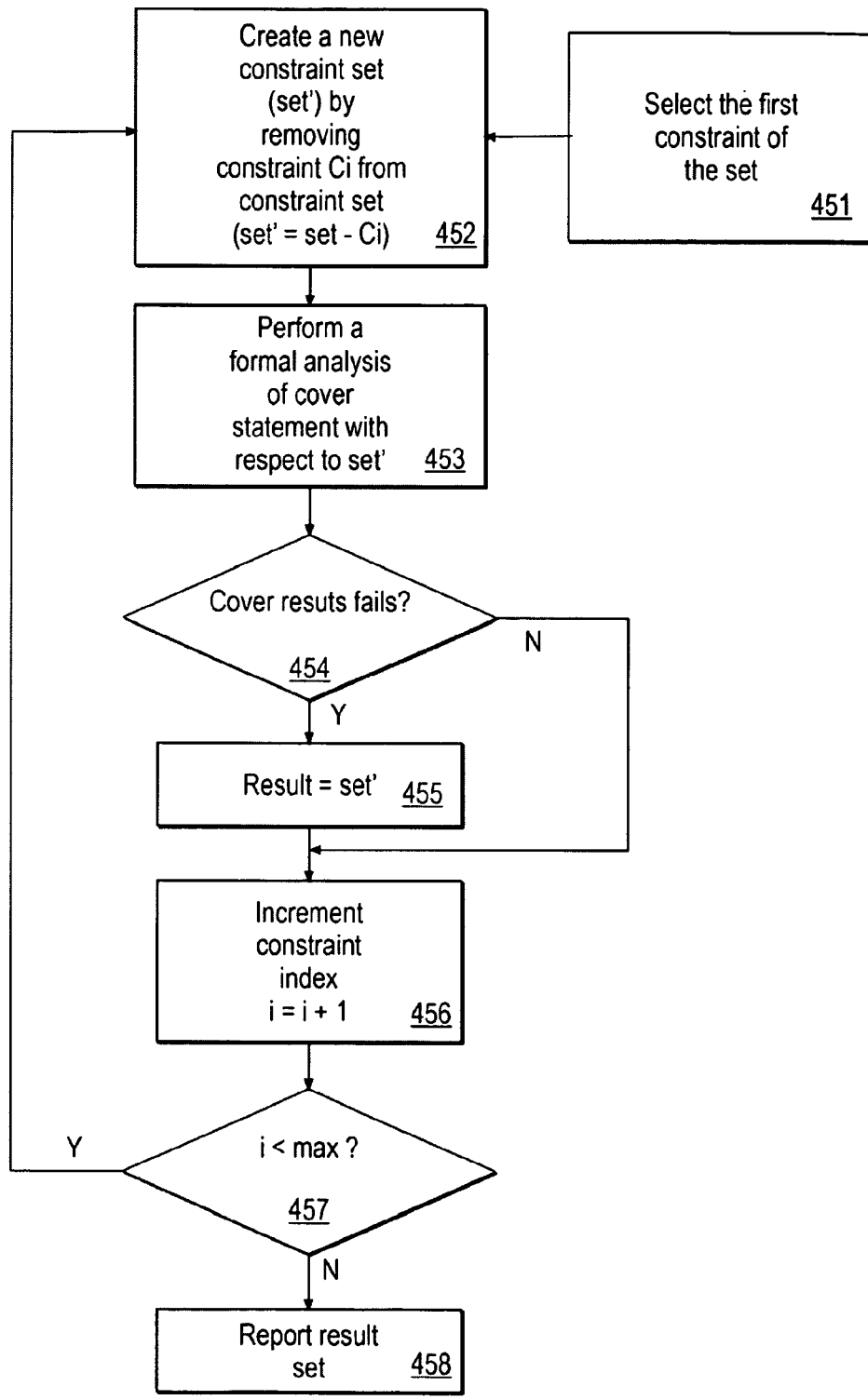
FIG. 4B is a flow chart showing the operation of another exemplary process for identifying, among a given set of constraints, a minimum subset of constraints that will maintain an over-constrained event.

FIG. 4B is a flow chart showing the operation of another exemplary process for identifying, among a given set of constraints, a minimum subset of constraints that will maintain an over-constrained event. In Block 451, a constraint Ci is selected from constraint set ASSUME. In Block 452, a new constraint set ASSUME' is generated by:

Let ASSUME'=ASSUME−{Ci}

In other words, constraint subset ASSUME' is generated by removing constraint Ci from constraint set ASSUME. In Block 453, a formal analysis is performed relative to constraint a cover check statement COV and constraint subset ASSUME'. If the formal analysis passes, then Result is set to be ASSUME' (Block 455). On the other hand, if cover check COV fails under ASSUME' on design D, the process proceeds to Block 456. Block 456 increments the constraint index by 1, and Block 457 determines whether the constraint index exceeds the maximum value of available constraint. If not, the process repeats Block 452. Otherwise, information related to Result is reported (Block 458). The reported Result is the minimum set of constraints.

The methodologies shown in FIGS. 4A and 4B may be used together or independently. For instance, the process described relative to FIG. 4A are useful in performing a binary search on a set of constraints to find out a subset on which cover check COV fails, and the subset identified by the process of FIG. 4A is incrementally improved using the process illustrated in FIG. 4B, to come up with a minimum subset.

Module Port Toggle Check

Typically, a circuit designer expects that it is always possible for each bit in a port (be it an input or an output) of a circuit to toggle between different states, such as '0' and '1.' If it is not possible for a port to toggle, the port is stuck to a constant value, which would render the functionality of the port meaningless. Hence, if a signal port cannot toggle, typically there is a problem in either the design itself, or the formal analysis environment (conflicting constraints or other over-constrained events).

An exemplary method according to this disclosure provides a check on the status of a signal port or functional modules of a circuit design, to verify that whether the signal states associated with the signal port can toggle between different signal states, such as '0' and '1.' An output is generated to indicate the check result. If the signal is able to change between states, information related to at least one of an over-constraint event and the signal port is generated.

The check can be implemented in a formal analysis tool by extracting the following PSL cover statements for each port:

Is it possible for port1 to go from high to low 1. cover {port1;!port1};

Is it possible for port1 to go from low to high 2. cover {!port1;port1}.

By automatically extracting and executing these checks, each signal port is checked to determine whether the port is able to toggle. The check result is made available to a reviewer or displayed on a graphic user interface (GUI). Hence, if this check fails, typically there is a problem in the design itself or an over-constrained event has occurred. An over-constrained situation in a formal analysis environment will often have the side effect of a port not being able to toggle and still obey all the constraints in the environment.

It would also be beneficial to identify any inputs and outputs of each module in the design that cannot be driven to 1 or 0. The intent is to identify any likely over-constrained situation by identifying these ports and reporting these results to the user. This report can be used to investigate the constraints placed on the design, in order to make a final determination. This process can be carried out by adding covers on each module port, that look for covering a port being 0 and 1 and using these results as the basis for reporting ports that could not attain either state. For example:

Given a design that has the following ports:
input a;
output [2:0] b;

The covers implicitly generated would be equivalent to:
The derived cover statement state:
See if it is possible to see a case where input a is high
cover {a}
See if it is possible to see a case where input a is low
cover {!a}
See if it is possible to see a case where bit 0 of output b is high
cover {b[0]}
See if it is possible to see a case where bit 0 of output b is low
cover {!b[0]}
etc.
cover {b[1]}
cover {!b[1]}
cover {b[2]}
cover {!b[2]}

Coverage results would be the basis for identifying ports that could not be driven to a one or zero.

Depth Determination

During detecting and debugging over-constrained events, it would be beneficial to provide information pertaining to the depth or clock cycles at which the environment becomes over-constrained. The information can be used in exposing over-constrained environments, or in debugging an over-constrained environment and understanding the root cause of the problem.

According to another embodiment of this disclosure, a machine-executed check is performed to determine at what depth does an over-constrained event occurs. Clock cycle information associated with the occurrence of the over-constrained event is obtained and reported.

Assuming the following constraints are placed in a formal analysis:
Assume that signal in is always low (0)
assume always {in==0};
Assume that signal in is always high (1)
assume always {in==1}.

The first constraint says that 'in' should always be '0,' and the second constraint says that 'in' should always be '1.' In this case, the environment is over-constrained all the time. It is not possible to generate a waveform which includes the signal 'in' of any length which obeys all the constraints in this environment.

The following example shows constraints that would have an over-constrained event occur some time after the initialization of the formal analysis:
Signal in should be low (0) in cycle 7 and from there on to infinity
1. assume always ({[*6]} 1=>{in==0}) @(posedge clk);
Signal in should be high (1) in cycle 7 and from there on to infinity
2. assume always ({[*6]} 1=>{in==1}) @(posedge clk).

Here, the first constraint says that after 6 clock cycles, 'in' should be '0,' and the second constraint says that after 6 clock cycles, 'in' should be '1.' In this case, an over-constrained event will occur only after 6 clock cycles. It is possible to generate waveforms up to 6 clock cycles which are consistent with the constraints, but it is not possible to generate longer waveforms which are consistent with the constraints.

An embodiment of this disclosure conducts formal analysis at multiple depths or clock cycles, and reports the results of those checks. An exemplary PSL description for checking depth N is given below:

Can there be a situation where all output are low (0) or any of the outputs is high (1) for N times in a row
cover {(all_output_0||any_output_1)[*N]}

In this example, all_output_0 is a wire which is 1 if all design outputs are 0; and any_output_1 is a wire which is 1 if any design output is 1. The term 'all_output_0 ||any_output_1' will always be true. By generating a PSL cover statement accordingly, a circuit verification tool will perform a reachability analysis on the entire design which will fail only due to an over-constraint situation. According to another embodiment, the formal analyses conducted at multiple depths or clock cycles are performed implicitly.

Another embodiment of this disclosure utilizes a discrete depth check to reduce requirements on computation resources. For example, a cover check is performed only at depths 0, 1, 2, 4, 8, 16, 32 and so on—until a time-out event occurs. Once a failure occurs due to an over-constrained situation, it is beneficial to know which depth is still not over-constrained and which depth is over-constrained. By increasing the jump of depths quickly when conducting vacuity checks, checks can be performed on relatively deep depths quickly.

Additional functionalities can be added such that once a failure is found, additional analyses are performed at selected depths. For instance, if a design passes at depth 16, but fails at depth 32, an automatic procedure is initiated to analyze the status for depth 24. A binary search algorithm can be utilized in performing the same process until two consecutive clock cycles are found to have a passing depth and a failing depth.

Auto Cover for Assertions

To determine which assertions are affected by an over-constrained event, an embodiment of this disclosure generates new description statements, such as new assertions, derived from the original assertions of circuit designs, and evaluates the new description statements for the purpose of debugging. The new description statements deriving from an original assertion will fail under an over-constrained situation, while the original assertion passes. These additional or derivative assertions are implemented as cover checks or are evaluated implicitly.

An exemplary method of this embodiment, when implemented on a data processing system, accesses assertion information related to a circuit design and constraints. The assertion information includes a pre-specified condition associated with a signal event. Derivative assertion information corresponding to the assertion information is then generated by removing the pre-specified condition from the assertion information. A verification process is performed on the derivative assertion information by applying the constraints. A result of the verifying is generated.

The intent of the derived assertion is to cover the sequence of the original assertion from start to end. By covering the entire sequence, the lack of progress in formal exploration (caused by over-constraining) can be detected in every cycle. Adding derivative assertions can assist detecting not only vacuous passes but also a situation when an assertion passes due to a cul-de-sac. For example a cover check would detect a case where a followed by b can occur but then a cul-de-sac happens and neither c nor d can be reached.

A formal analysis performed on a derivative assertion can have many different fail conditions. If the original assertion passed the formal analysis due to an over-constrained situation, the checks performed on a derivative assertion are likely to fail. The generation of these derivative assertions can be implicit (without exposing these checks to the user) or explicit (by generating the actual cover checks).

Various examples of derivative assertions or cover checks are provided below.

Example in PSL:
  Check if signal a being high, followed by signal b being high, and signal c being high followed by signal d being high in the next two cycles (the condition is that signal a and b being high first):
    original_psl: assert always {a;b} |=>{c;d};
  Is it possible to see a sequence where signal a being high, followed by signal b being high, followed by signal c being high, followed by signal d being high:
    derived_psl: cover {a;b;c;d};
  Equivalent Example in SVA:
    original_sva: assert property (@(posedge clk) (a ## 1 b)|=<(c ##1 d));
    cover_sva: cover property (@(posedge clk) (a ## 1 b ##1 c ## 1 d));

It is understood that similar approaches may be applied to different languages (such as SVA, PSL, Temporal e) as well as property libraries (such as OVL).

The same concept for generating an auto cover or derivative cover checks for assertions can be equally applied to constraints. Instead of deriving the cover checks from assertions, the cover checks are derived from constraints. By applying this method to constraints, the detection is moved closer to the source of the problem (the set of constraints that cause the over-constrained situation). Hence it will be possible to identify which constraints are involved in over-constrained situation.

Various exemplary definitions for derivative assertions or derived cover checks are shown in below, in PSL/SVA format. The derived cover checks are shown in PSL format.

1) At the positive edge of the clock if you see signal a high then signal b has to be high at the same time (the condition is that signals a and b have to be high "at the same time"). This is captured in the assertion below:
  PSL: A1=always (a->b) @(posedge clk);
  SVA: @(posedge clk) ((a) |->(b));
  This is to check that at the positive edge of the clock, whether it is possible to see signal a being high and signal b being high. This is automatically extracted from assertion A1 as a 'cover' check as given below:
  Derived: cover {a && b} @(posedge clk);

2) Same as item 1. However if signal c is high the previous statement does not have to be checked. An assertion to capture this kind of behavior is given below—
  PSL: A2=always ((a->b) abort c)) @(posedge clk);
  SVA: @(posedge clk) disable iff(c) ((a) |->(b));
  This is to check that at the positive edge of the clock, whether it is possible to see signal a being high and signal b being high and signal c being low (so that the abort gets masked). This is automatically extracted from assertion A2 as a 'cover' check given below:
  Derived: cover {a && b &&!c} @(posedge clk);

3) At the positive edge of the clock if you see that a sequence S1 occurred then you need to see the sequence S2 starting in the last cycle of S1.
  PSL: A3=always (S1 |->S2) @(posedge clk);
  SVA: @(posedge clk) ((S1) |->(S2));
  Automatically extracted 'cover' check for assertion A3 is given below:
  Derived: cover {{S1}: {S2}} @(posedge clk);

4) Same as item3. However if signal c is high the previous statement does not have to be checked.
  PSL: A4=always ((S1 |->S2) abort c)) @(posedge clk);
  SVA: @(posedge clk) disable iff(c) ((S1) |->(S2));
  Derived: cover {{{S1}: {S2}} && {!c[*]}} @(posedge clk);

5) At the positive edge of the clock if you see that a sequence S1 occurred then you need to ensure that sequence S2 starting one cycle after sequence S1 completed must occur. Behavior of this form is captured in following assertion. The automatically extracted 'cover' check is also shown.
  PSL: A5=always (S1 |=>S2) @(posedge clk);
  SVA: @(posedge clk) ((S1) |=>(S2));
  Derived: cover {{S1}; {S2}} @(posedge clk);

6) Same as item5. However, if signal c is high, the previous statement does not have to be checked. The assertion for this behavior and derived 'cover' checks are shown below:
  PSL: A6=always ((S1|=>S2) abort c)) @(posedge clk);
  SVA: @(posedge clk) disable iff(c) ((S1) |=>(S2));
  Derived: cover {{{S1}; {S2}} && {!c[*]}} @(posedge clk);

Indication of Last-Reachable Cycle

In debugging an over-constrained situation, it would be beneficial to obtain information related to the over-constrained situation, such as the cycle where an assertion is stuck, or the number of clock cycles that progress was made.

Below is a set of examples that showcases an exemplary process for providing additional information associated with an over-constrained event.

EXAMPLE 1

The assertion stated. Check if signal a is high, followed by signal b being high, then signal c needs to be high, followed by signal d being high in the next two cycles.
always {a;b}|=> {c;d};
|
Fully over-constrained. It cannot even reach a. cycle 0 of 4.
always {a;b}|=> {c;d};
|
Partially over-constrained. Can reach b but gets stuck at b. Cycle 2 of 4.
always {a;b}|=> {c;d};
|
Partially over-constrained. Can reach c but gets stuck at c. Cycle 3 of 4.

This example would show the cycle where an assertion gets stuck. It could also report this information in terms of a number. For instance, in the above example the assertion has 4 cycles. If the progress was made to less than 4 cycles, then we have an over-constrained situation. Hence, the information can be reported in a format of N/M, where M is the max depth of the assertion and N is the progress depth. The information will show where (in which assertion cycle) exploration progress got stuck.

The information can be derived from a set of automatically generated cover check (similar to auto cover for assertions) for different languages or property libraries. Rather than generating one cover check that reaches all the way to the end of the assertion, a set of assertions is provided in order to detect the depth. An example of cover checks for obtaining additional information is shown below:

The assertion stated. Check if you see signal a being high followed by b being high, then you need to see signal c high followed by d high in the next two cycles.
// original_psl: assert always {a;b}|=> {c;d};
There derive cover statement state:
See if it is possible to see a case where signal a is high
// derived1_psl: cover {a};
See if it is possible to see a case where signal a is high followed by b high
// derived2_psl: cover {a; b};
See if it is possible to see a case where signal a is high followed by b high followed by c high
// derived3_psl: cover {a; b; c};

The generation of these cover checks can be implicit (without exposing these checks to the user) or explicit (by generating the actual cover checks).

According to another embodiment, other information that is useful in debugging an over-constrained situation is provided. Exemplary information includes the number of internal state-bits that never change (constant state-bits, which may be indicative of an over-constrained situation); FSM live locks, which indicates the design goes into an infinite loop repeating a set of states or an over-constrained situation.

Another embodiment of this disclosure uses functional coverage points, embedded or contained in library elements, for validating formal environments. For example, a fifo verification component is utilized to monitor coverage points of interests, such as a fifo full condition, fifo empty, fifo more than ½ way full, etc. These coverage points are likely to indicate an over-constrained situation if these cover points can not be hit.

Another embodiment of this disclosure is useful in identifying a situation where a formal verification wrongfully declares a property pass due to incorrect environment. This happens when environment is over constrained. This problem is typically solved by adding sanity checks. The sanity checks are coded using cover statements on the design behavior. In contrast, the embodiment automatically generates the sanity checks.

Consider the Following Example:
Check if a sequence S1 occurs then a sequence S2 has to occur starting from the last cycle of S1
    assert always S1 |->S2;
Here the sequence S1 is identified as the trigger for this property. Here S1 may not happen and so there is no requirement that S2 should happen. Under this circumstance, the property is said to pass the evaluation. However, such passing result may be inaccurate, caused by a false evaluation of the property. For instance, S1 could be over-constrained, causing it not to happen. Hence the check whether S1 has happened will help the user identify whether a pass on a property is verified when the enable condition is happening also. This could be implemented using PSL cover as given below:
    cover {S1};
The cover will verify whether S1 has happened.

Exemplary definitions of trigger in PSL/SVA for different forms:
1) PSL: A1=always (a->b) @(posedge clk);
   SVA: @(posedge clk) ((a) |->(b));
   Trigger: cover {a} @(posedge clk);
2) PSL: A2=always ((a->b) abort c)) @(posedge clk);
   SVA: @(posedge clk) disable iff(c) ((a) |->(b));
   Trigger: cover {a &&!c} @(posedge clk);
3) PSL: A3=always (S1 |->S2) @(posedge clk);
   SVA: @(posedge clk) ((S1) |->(S2));
   Trigger: cover {S1} @(posedge clk);
4) PSL: A4=always ((S1 |->S2) abort c)) @(posedge clk);
   SVA: @(posedge clk) disable iff(c) ((S1) |->(S2));
   Trigger: cover {{S1} && {!c[*]}} @(posedge clk);
5) PSL: A5=always (S1 |=>S2) @(posedge clk);
   SVA: @(posedge clk) ((S1) |=>(S2));
   Trigger: cover {S1} @(posedge clk);
6) PSL: A6=always ((S1 |=>S2) abort c)) @(posedge clk);
   SVA: @(posedge clk) disable iff(c) ((S1) |=>(S2));
   Trigger: cover {{S1} && {!c[*]}} @(posedge clk);
7) PSL: A7=always (a->FL) @(posedge clk);
   SVA: @(posedge clk) ({a} |->(FL)); Trigger: cover {a} @(posedge clk);
8) PSL: A8=always ((a->FL) abort c) @(posedge clk);
   SVA: @(posedge clk) disable iff(c) ({a} |->(FL));
   Trigger: cover {a &&!c} @(posedge clk);
Note: The extracted trigger is shown in PSL format only.

The above exemplary definitions could be extended in verifying whether an enable condition is completely met in a case there are multiple implications in the property. Consider the following examples:
   Check if a sequence S1 occurs then a sequence S2 has to occur starting from the last cycle of S1. After that if sequence S2 occurred then sequence S3 has to occur starting from the last cycle of S2.
      always S1|->S2|->S3;
   Check if a sequence S1 occurs then a sequence S2 has to occur starting from one cycle after S1 has completed. After that if sequence S2 occurred then sequence S3 has to occur starting from the last cycle of S2.
      always S1|=>S2|->S3;
An exemplary cover check for all parts of the assertion up to the point when a failure can occur is provided below:
   cover {S1:S2};
   cover {S1;S2}

Figure 5:
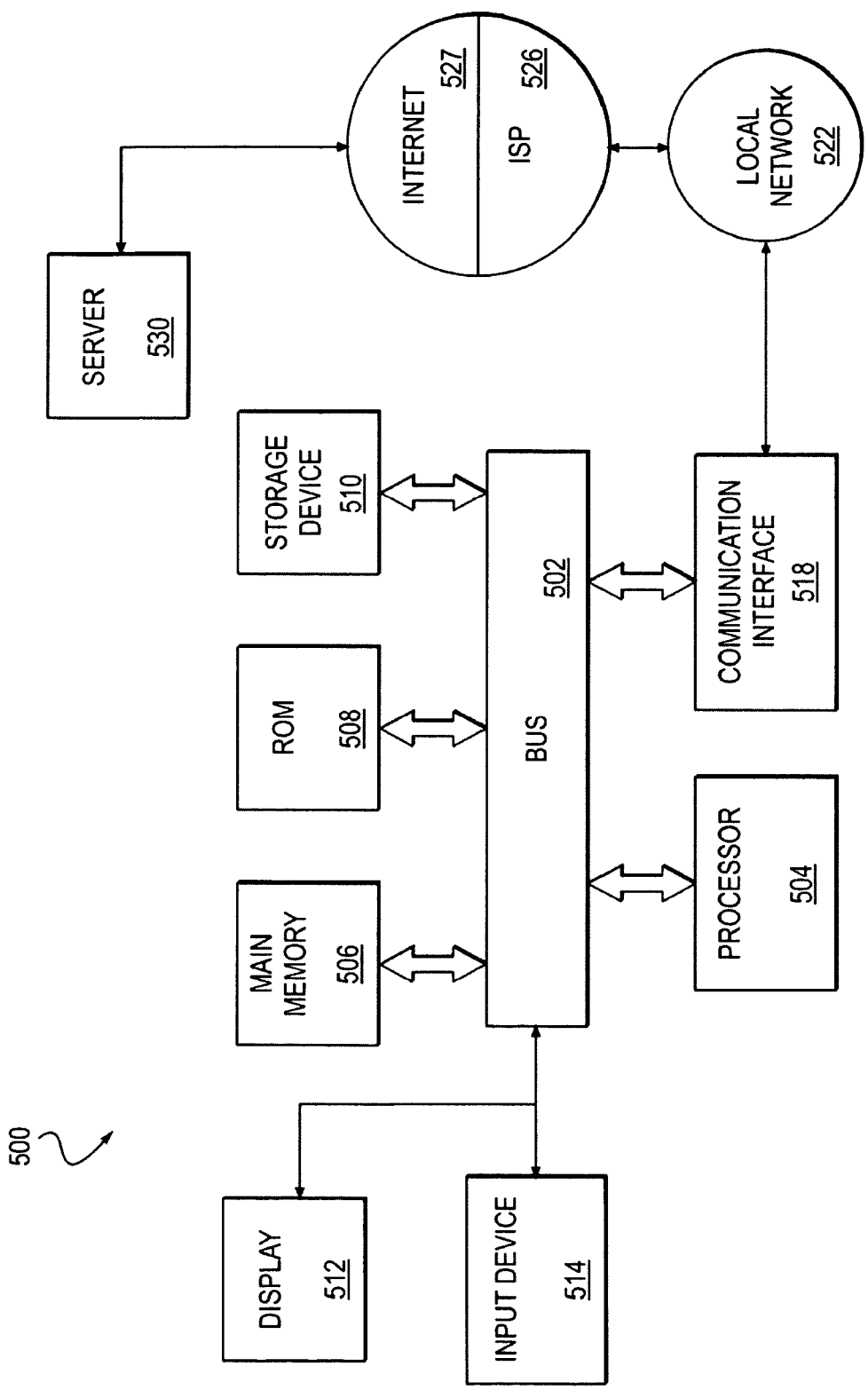
FIG. 5 is a block diagram of an exemplary data processing system on which the concepts and embodiments of this disclosure may be implemented.

FIG. 5 shows a block diagram of an exemplary data processing system upon which the above-described techniques, methods, concepts and embodiments can be implemented. The data processing system 500 includes a bus 502 or other communication mechanism for communicating information, and a data processor 504 coupled with bus 502 for processing data. Data processing system 500 also includes a main memory 506, such as a random access memory (RAM) or other dynamic storage device, coupled to bus 502 for storing information and instructions to be executed by processor 504. Main memory 506 also may be used for storing temporary variables or other intermediate information during execution of instructions to be executed by data processor 504. Data processing system 500 further includes a read only memory (ROM) 508 or other static storage device coupled to bus 502 for storing static information and instructions for processor 504. A storage device 510, such as a magnetic disk or optical disk, is provided and coupled to bus 802 for storing information and instructions.

The data processing system 500 may be coupled via bus 502 to a display 512, such as a cathode ray tube (CRT) or liquid crystal display (LCD), for displaying information to an operator. An input device 514, including alphanumeric and other keys, is coupled to bus 502 for communicating information and command selections to processor 504. Another type of user input device is cursor control 516, such as a mouse, a trackball, or cursor direction keys and the like for communicating direction information and command selections to processor 804 and for controlling cursor movement on display 512.

The data processing system 500 is controlled in response to processor 504 executing one or more sequences of one or more instructions contained in main memory 506. Such instructions may be read into main memory 506 from another machine-readable medium, such as storage device 510. Execution of the sequences of instructions contained in main memory 506 causes processor 504 to perform the processes described herein. In alternative embodiments, hard-wired circuitry may be used in place of or in combination with software instructions to implement the disclosure. Thus, embodiments of the disclosure are not limited to any specific combination of hardware circuitry and software. The above-described techniques, methods, concepts and embodiments are implemented as instructions or software embedded in machine-readable medium which, upon execution by the data processing system, control the data processing system perform the intended process as specified in the instructions.

The term "machine readable medium" as used herein refers to any medium that participates in providing instructions to processor 504 for execution. Such a medium may take many forms, including but not limited to, non-volatile media, volatile media, and transmission media. Non-volatile media includes, for example, optical or magnetic disks, such as storage device 510. Volatile media includes dynamic memory, such as main memory 506. Transmission media includes coaxial cables, copper wire and fiber optics, including the wires that comprise bus 502. Transmission media can also take the form of acoustic or light waves, such as those generated during radio wave and infrared data communications.

Common forms of machine readable media include, for example, a floppy disk, a flexible disk, hard disk, magnetic tape, or any other magnetic medium, a CD-ROM, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a data processing system can read.

Various forms of machine-readable media may be involved in carrying one or more sequences of one or more instructions to processor 504 for execution. For example, the instructions may initially be carried on a magnetic disk of a remote data processing system, such as a server. The remote data processing system can load the instructions into its dynamic memory and send the instructions over a telephone line using a modem. A modem local to data processing system 500 can receive the data on the telephone line and use an infrared transmitter to convert the data to an infrared signal. An infrared detector can receive the data carried in the infrared signal and appropriate circuitry can place the data on bus 502. Bus 502 carries the data to main memory 506, from which processor 504 retrieves and executes the instructions. The instructions received by main memory 506 may optionally be stored on storage device 510 either before or after execution by processor 504.

Data processing system 500 also includes a communication interface 518 coupled to bus 502. Communication interface 518 provides a two-way data communication coupling to a network link 520 that is connected to a local network 522. For example, communication interface 518 may be an integrated services digital network (ISDN) card or a modem to provide a data communication connection to a corresponding type of telephone line. As another example, communication interface 518 may be a local area network (LAN) card to provide a data communication connection to a compatible LAN. Wireless links may also be implemented. In any such implementation, communication interface 518 sends and receives electrical, electromagnetic or optical signals that carry digital data streams representing various types of information.

Network link 520 typically provides data communication through one or more networks to other data devices. For example, network link 520 may provide a connection through local network 522 to a host data processing system or to data equipment operated by an Internet Service Provider (ISP) 526. ISP 526 in turn provides data communication services through the world large packet data communication network now commonly referred to as the Internet 527. Local network 522 and Internet 527 both use electrical, electromagnetic or optical signals that carry digital data streams. The signals through the various networks and the signals on network link 520 and through communication interface 518, which carry the digital data to and from data processing system 500, are exemplary forms of carrier waves transporting the information.

Data processing system 500 can send messages and receive data, including program code, through the network(s), network link 520 and communication interface 518. In the Internet example, a server 530 might transmit a requested code for an application program through Internet 527, ISP 526, local network 522 and communication interface 518.

The data processing system 500 also has various signal input/output ports (not shown in the drawing) for connecting to and communicating with peripheral devices, such as USB port, PS/2 port, serial port, parallel port, IEEE-1394 port, infra red communication port, etc., or other proprietary ports. The data processing system 500 may communicate with the data processing system via such signal input/output ports.

The disclosure has been described with reference to specific embodiments thereof. It will, however, be evident that various modifications and changes may be made thereto without departing from the broader spirit and scope of the disclosure. The concepts described in the disclosure can apply to various operations of the networked presentation system without departing from the concepts. The specification and drawings are, accordingly, to be regarded in an illustrative rather than a restrictive sense.

What is claimed is:

1. A computer-implemented method for providing information associated with an over-constrained event in verification of a circuit design, wherein the computer performs the following functions comprising:
   accessing assertion information related to the circuit design;
   accessing information related to conflicting constraints, wherein at least one of the conflicting constraints specifies a condition associated with a first signal event triggering a check of a second signal event;
   generating a derivative assertion corresponding to the at least one of the conflicting constraints by removing the condition from the at least one of the conflicting constraints;
   verifying the derivative assertion by applying the conflicting constraints; and
   generating a result of the verifying.

2. The computer-implemented method of claim 1, wherein the result of the verifying generated indicates which assertion is affected by an over-constrained event.

3. The computer-implemented method of claim 1, wherein the result of the verifying generated indicates whether the first signal event occurs during the verification.

4. A non-transitory computer readable storage medium containing program instructions, wherein execution of program instructions by one or more processors of a computer causes the one or more processors to carry out the steps of:
   accessing assertion information related to the circuit design;

accessing information related to conflicting constraints, wherein at least one of the conflicting constraints specifies a condition associated with a first signal event triggering a check of a second signal event;

generating a derivative assertion corresponding to the at least one of the conflicting constraints by removing the condition from the at least one of the conflicting constraints;

verifying the derivative assertion by applying the conflicting constraints; and generating a result of the verifying.

5. The non-transitory computer readable storage medium of claim 4, wherein the result of the verifying generated indicates which assertion is affected by an over-constrained event.

6. The non-transitory computer readable storage medium of claim 4, wherein the result of the verifying generated indicates whether the first signal event occurs during the verification.

7. A computer-implemented system for providing information associated with an over-constrained event in verification of a circuit design, wherein the computer-implemented system executes instructions on a non-transitory computer readable medium for performing the following functions comprising:

accessing assertion information related to the circuit design;

accessing information related to conflicting constraints, wherein at least one of the conflicting constraints specifies a condition associated with a first signal event triggering a check of a second signal event;

generating a derivative assertion corresponding to the at least one of the conflicting constraints by removing the condition from the at least one of the conflicting constraints;

verifying the derivative assertion by applying the conflicting constraints; and generating a result of the verifying.

8. The computer-implemented system of claim 7, wherein the result of the verifying generated indicates which assertion is affected by an over-constrained event.

9. The computer-implemented system of claim 7, wherein the result of the verifying generated indicates whether the first signal event occurs during the verification.

* * * * *